(12) United States Patent
Huang

(10) Patent No.: US 11,830,907 B2
(45) Date of Patent: Nov. 28, 2023

(54) SEMICONDUCTOR STRUCTURE AND METHOD OF FORMING THE SAME

(71) Applicant: NANYA TECHNOLOGY CORPORATION, New Taipei (TW)

(72) Inventor: Shih-Ting Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/658,448

(22) Filed: Apr. 8, 2022

(65) Prior Publication Data

US 2023/0326957 A1 Oct. 12, 2023

(51) Int. Cl.
*H10B 12/00* (2023.01)
*H01L 49/02* (2006.01)

(52) U.S. Cl.
CPC .............. *H01L 28/75* (2013.01); *H01L 28/91* (2013.01); *H01L 28/92* (2013.01); *H10B 12/033* (2023.02); *H10B 12/31* (2023.02)

(58) Field of Classification Search
CPC ......... H01L 28/75; H01L 28/91; H01L 28/92; H10B 12/033; H10B 12/31
See application file for complete search history.

(56) References Cited

U.S. PATENT DOCUMENTS

| 6,049,101 | A  | * | 4/2000 | Graettinger | H01L 28/91 |
| | | | | | 257/296 |
| 10,249,706 | B1 | * | 4/2019 | Chang | H10B 12/0335 |
| 2010/0200901 | A1 | * | 8/2010 | Kim | H01L 28/91 |
| | | | | | 257/306 |
| 2020/0098781 | A1 | * | 3/2020 | Xiao | G11C 16/0483 |
| 2020/0152584 | A1 | * | 5/2020 | Sohn | H01L 21/32139 |
| 2020/0251486 | A1 | | 8/2020 | Tsutsumi et al. | |
| 2020/0303492 | A1 | * | 9/2020 | Kim | H01L 28/90 |
| 2021/0082844 | A1 | * | 3/2021 | Kim | H01L 28/90 |
| 2021/0118705 | A1 | * | 4/2021 | Choi | H10B 12/31 |
| 2021/0257371 | A1 | * | 8/2021 | Son | H10B 12/34 |
| 2021/0272959 | A1 | * | 9/2021 | Kim | H10B 12/033 |
| 2022/0208959 | A1 | * | 6/2022 | Tsai | H10B 20/50 |

FOREIGN PATENT DOCUMENTS

KR 101090369 * 12/2011

OTHER PUBLICATIONS

KR-101090369 (Year: 2011).*

* cited by examiner

*Primary Examiner* — Ahmed N Sefer
(74) *Attorney, Agent, or Firm* — CKC & Partners Co., LLC

(57) ABSTRACT

A method of forming a semiconductor structure includes following steps. A substrate is provided. The substrate has an active region, an isolation structure adjacent to the active region, and a contact on the active region. A dielectric stack is formed on the substrate. A poly layer is formed on the dielectric stack. The poly layer and the dielectric stack are etched to form an opening to expose the contact of the substrate. A conductive film is formed in the opening and an ALD oxide layer is deposited on a sidewall of the opening. In addition, a semiconductor structure is also disclosed herein.

11 Claims, 6 Drawing Sheets

SEMICONDUCTOR STRUCTURE AND METHOD OF FORMING THE SAME

BACKGROUND

Technical Field

The present disclosure relates to a semiconductor structure and a method of forming the semiconductor structure.

Description of Related Art

Capacitors are used in a wide variety of semiconductor circuits. For example, the capacitors are used in DRAM (dynamic random access memory) memory circuits or any other type of memory circuit. DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components, a storage capacitor and an access field effect transistor.

In the semiconductor manufacturing process, the critical dimensions of the capacitors can be easily enlarged when the hardmask is etched by the etching gas so as to result in a short circuit between the capacitors. Therefore, there is a need to protect the lower electrode plate in a chemical-mechanical polishing (CMP) process and prevent the CMP slurry from falling into the openings between the capacitors.

SUMMARY

One aspect of the present disclosure is a method of forming a semiconductor structure.

According to some embodiments of the present disclosure, a method of forming a semiconductor structure includes following steps. A substrate is provided. The substrate has an active region, an isolation structure 114 adjacent to the active region, and a contact on the active region. A dielectric stack is formed on the substrate. A poly layer is formed on the dielectric stack. The poly layer and the dielectric stack are etched to form an opening to expose the contact of the substrate. A conductive film is formed in the opening and an ALD oxide layer is deposited on a sidewall of the opening.

In some embodiments, a top portion of the opening is sealed by the ALD oxide layer.

In some embodiments, portions of the poly layer, the conductive film and the ALD oxide layer are polished.

In some embodiments, the poly layer, the conductive film and the ALD oxide layer are polished about 300-400 nm at a periphery area and about 100-200 nm at a poly array area.

In some embodiments, the poly layer is etched back by Boron Trichloride ($BCl_3$) and Chlorine ($Cl_2$).

In some embodiments, at least two harkmask layers are deposited thereon.

In some embodiments, the conductive film is in contact with the contact of the substrate.

In some embodiments, forming the dielectric stack includes forming a first oxide structure over the substrate and forming a second oxide structure over the first oxide structure.

In some embodiments, forming the dielectric stack includes forming a first nitride structure over the substrate, forming a second nitride structure over the first oxide structure, and forming a third nitride structure over the second oxide structure.

In some embodiments, forming the second nitride structure over the first oxide structure is performed such that the first oxide structure is between the first nitride structure and the second nitride structure.

In some embodiments, forming the third nitride structure over the second oxide structure is performed such that the second oxide structure is between the second nitride structure and the third nitride structure.

In some embodiments, etching the poly layer and the dielectric stack to form the opening is performed by dry etching.

Another aspect of the present disclosure is a semiconductor structure.

According to some embodiments of the present disclosure, a semiconductor structure includes a substrate, a dielectric stack, a poly layer, a conductive film and an ALD oxide layer. The substrate has an action region, an isolation structure adjacent to the active region, and a contact on the active region. The dielectric stack is disposed on the substrate. The poly layer is formed on the dielectric stack and the poly layer and the dielectric stack include an opening therein. The conductive film is formed in the opening and the ALD oxide layer seals a top portion of the opening.

In some embodiments, the dielectric stack further includes a first oxide structure and a second oxide structure. The first oxide structure is disposed over the substrate. The second oxide structure is disposed over the first oxide structure.

In some embodiments, the dielectric stack further includes a first nitride structure, a second nitride structure, and a third nitride structure. The first nitride structure is disposed over the substrate. The second nitride structure is disposed over the first nitride structure. The third nitride structure is disposed over the second nitride structure.

In some embodiments, the first oxide structure is between the first nitride structure and the second nitride structure, and the second oxide structure is between the second nitride structure and the third nitride structure.

In some embodiments, the first oxide structure and the second oxide structure are made of different materials.

In some embodiments, the first oxide structure is made of borophosphosilicate glass (BPSG).

In some embodiments, the second oxide structure is made of tetraethoxysilane (TEOS).

In the aforementioned embodiments, since the top portion of the opening is sealed by the ALD oxide layer, the lower electrode plate in a chemical-mechanical polishing (CMP) process can be protected and the CMP slurry can be prevented from falling into the openings between the capacitors.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
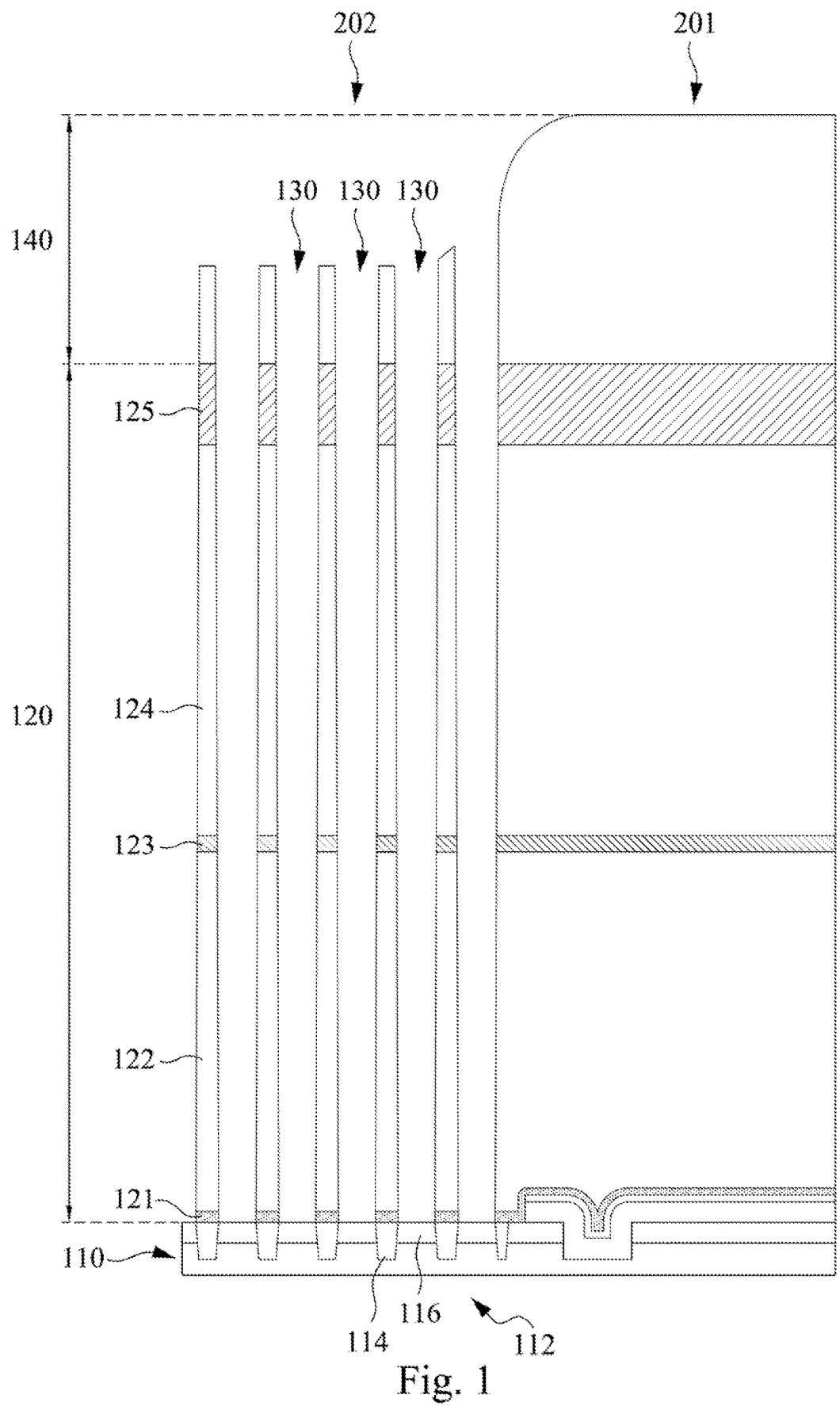
FIGS. 1 to 6 are cross-sectional views of a method of forming a semiconductor structure at various stages in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
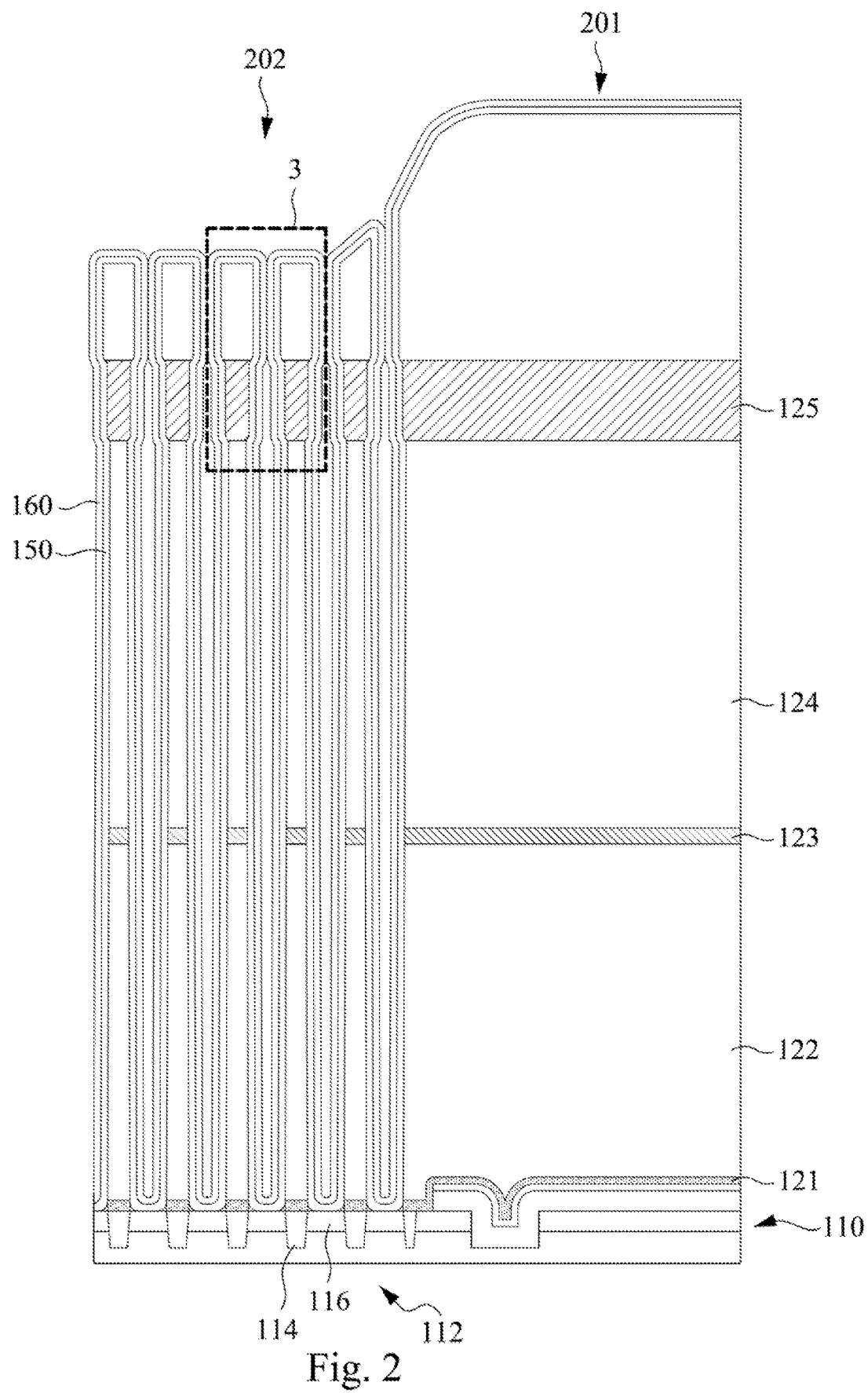
Figure 3:
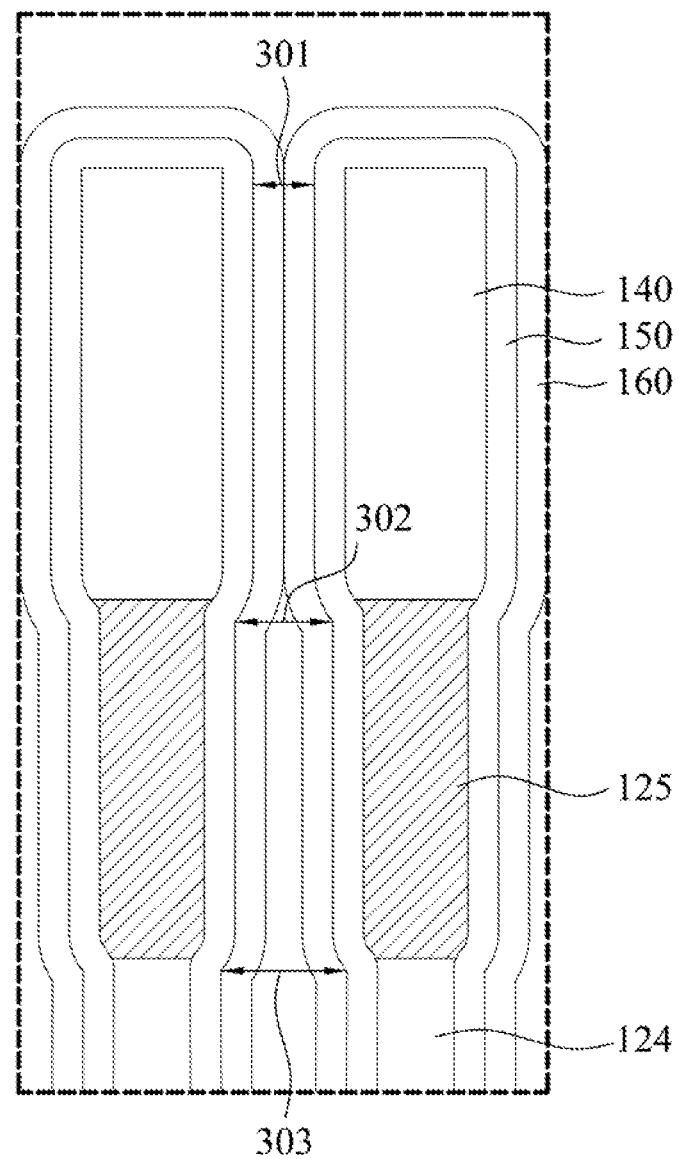

FIGS. 1 to 6 are cross-sectional views of a method of forming a semiconductor structure at various stages in accordance with some embodiments of the present disclosure. In addition, FIG. 3 is a partial enlarged view of FIG. 2.

Referring to FIG. 1, a substrate 110 is provided. The substrate 110 has an active region 112, an isolation structure 114 adjacent to the active region 112, and a contact 116 on the active region 112. In some embodiments, the active regions 112 may be made of silicon. The isolation structure 114 may be made of oxide, such as silicon oxide or other suitable material. The isolation structure 114 may be a shallow trench isolation (STI) structure. The contact 116 may be made of a conductive material, such as tungsten (W).

In addition, a dielectric stack 120 is formed on the substrate 110. The dielectric stack 120 includes a first oxide structure 122 and a second oxide structure 124 over the first oxide structure 122. The dielectric stack 120 further includes a first nitride structure 121 over the substrate 110, a second nitride structure 123 over the first oxide structure 122, and a third nitride structure 125 over the second oxide structure 124. In greater details, the first nitride structure 121, the first oxide structure 122, the second nitride structure 123, the second oxide structure 124, and the third nitride structure 125 are formed in sequence over the substrate 110. In other words, forming the second nitride structure 123 over the first oxide structure 122 is performed such that the first oxide structure 122 is between the first nitride structure 121 and the second nitride structure 123, and forming the third nitride structure 125 over the second oxide structure 124 is performed such that the second oxide structure 124 is between the second nitride structure 123 and the third nitride structure 125. The first nitride structure 121 is in contact with the isolation structure 114 and the contact 116 of the substrate 110.

In some embodiments, the first nitride structure 121, the second nitride structure 123, and the third nitride structure 125 may be made of same materials. For example, the first nitride structure 121, the second nitride structure 123, and the third nitride structure 125 may be made of silicon nitride. In some embodiments, the first oxide structure 122 and the second oxide structure 124 are made of different materials or same material. The first oxide structure 122 may include boron (B), phosphorus (P), or a combination thereof. For example, the first oxide structure 122 is made of borophosphosilicate glass (BPSG), and the second oxide structure 124 is made of tetraethoxysilane (TEOS), borophosphosilicate glass, or the like.

Furthermore, a poly layer 140 is formed on the dielectric stack 120. In addition, the poly layer 140 and the dielectric stack 120 are etched to form openings 130 such that the contacts 116 of the substrate 110 are exposed. The opening 130 has a bottom portion and a top portion communicated to the bottom portion. In greater details, the bottom portion of the opening 130 is surrounded by the first oxide structure 122 and the top portion of the opening 130 is surrounded by the poly layer 140.

In some embodiments, etching the poly layer 140 and the dielectric stack 120 to form the opening 130 is performed by a dry etching process. For example, a dry etchant, such as hydrogen ($H_2$) and nitrogen ($N_2$), may be selected for the dry etching process.

Referring to FIG. 2 and FIG. 3, a conductive material is deposited on the surface of the opening 130 to form a conductive film 150. The conductive film 150 is formed on the surface of the openings 130 of the poly layer 140 and the dielectric stack 120, and the conductive film 150 is in contact with the contact 116 of the substrate 110. In greater details, the conductive film 150 is surrounded by the poly layer 140 and the dielectric stack 120. In some embodiments, the conductive film 150 may be referred as an electrode plate of the capacitor, for example, a bottom electrode plate.

In addition, an atomic layer deposition (ALD) oxide layer 160 is formed on the conductive film 150, that is, the conductive film 150 and the ALD oxide layer 160 are formed on the sidewall of the opening 130.

In some embodiments, the ALD oxide layer 160 is formed on the sidewall of the opening 130 at 275 to 300 degrees Celsius for about 12 hours.

Therefore, a first width 301 of the conductive film 150 at the top portion of the opening 130 is smaller than a second width 302 of the conductive film 150 adjacent to the top interface of the third nitride structure 125 in the opening 130, and the second width 302 is smaller than a third width 303 of the conductive film 150 adjacent to the bottom interface of the third nitride structure 125 in the opening 130.

In addition, after the ALD oxide layer 160 is formed on the sidewall of the opening 130, the top portion of the opening 130 is sealed by the ALD oxide layer 160.

Accordingly, the opening 130 is sealed by the ALD oxide layer 160 can effectively protect the bottom-electrode film and avoid CMP slurry falling into the opening 130 with the high temperature ALD oxide layer formed along the opening 130 after the bottom-electrode film is formed therein.

In some embodiments, the conductive film 150 is made of conductive materials, such as titanium nitride (TiN).

Figure 4:
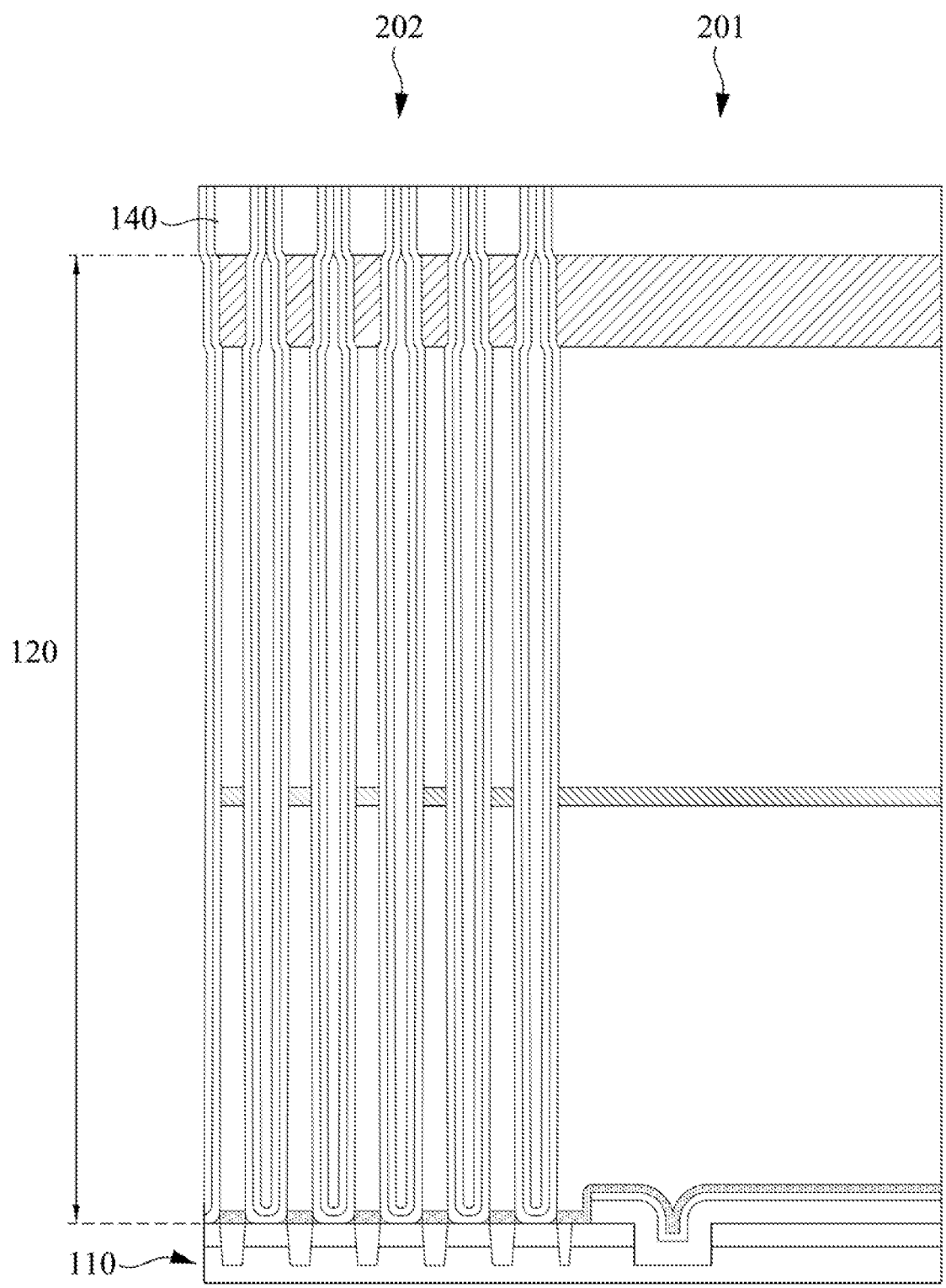

Referring to FIG. 4, the poly layer 140, the conductive film 150 and the ALD oxide layer 160 are subsequently performed a planarization process, such as a chemical-mechanical polishing (CMP) process.

In some embodiments, the poly layer 140, the conductive film 150 and the ALD oxide layer 160 are polished about 300-400 nm (nanometer) at a periphery area 201 and about 100-200 nm at a poly array area 202.

Figure 5:
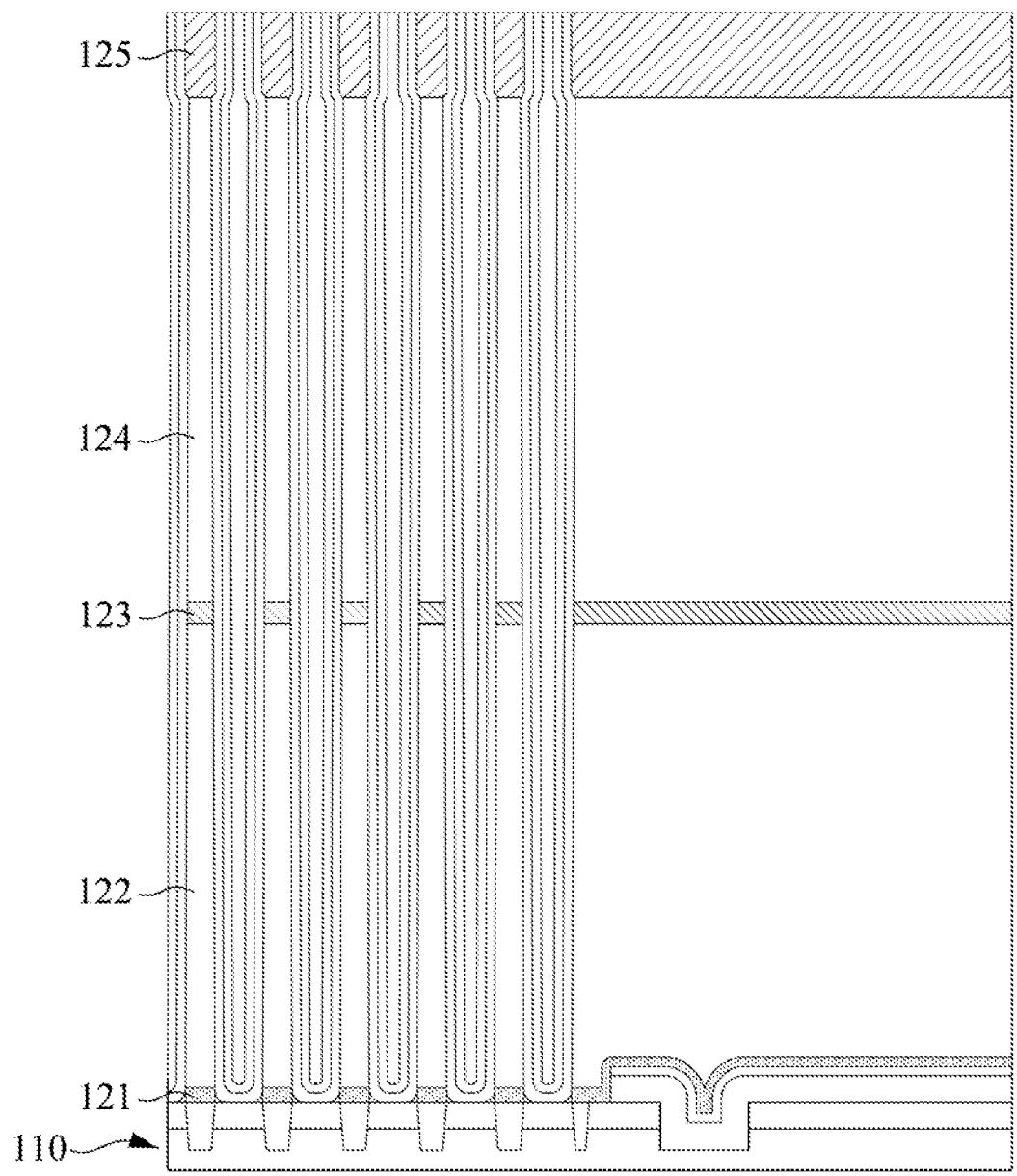

Referring to FIG. 5, the residual poly layer 140 and the third nitride structure 125 are further be etched back by a dry etch back process with Boron Trichloride ($BCl_3$) and Chlorine ($Cl_2$) to expose the opening 130 again.

Figure 6:
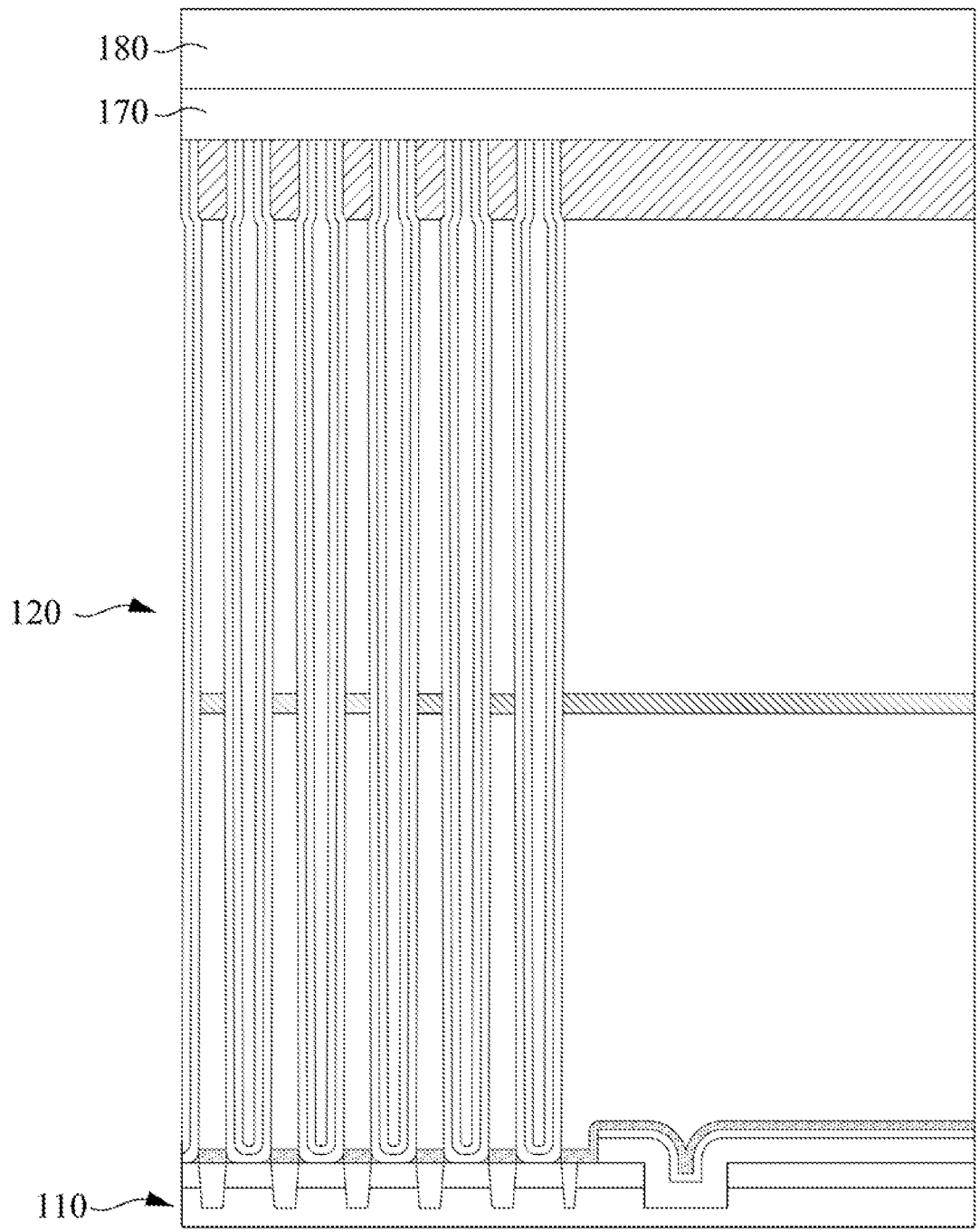

Referring to FIG. 6, two harkmask layers are deposited on the third nitride structure 125. In some embodiments, the two harkmask layers includes a fourth nitride structure 170 on the third nitride structure 125 and a third oxide structure 180 on the fourth nitride structure 170.

Accordingly, since the top portion of the opening is sealed by the ALD oxide layer, the lower electrode plate in a chemical-mechanical polishing process can be protected and the CMP slurry can be prevented from falling into the openings between the capacitors.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
    providing a substrate, wherein the substrate has an active region, an isolation structure adjacent to the active region, and a contact on the active region;
    forming a dielectric stack on the substrate;
    forming a poly layer on the dielectric stack;
    etching the poly layer and the dielectric stack to form an opening to expose the contact of the substrate;
    forming a conductive film in the opening;
    depositing an ALD oxide layer on a sidewall of the opening; and
    polishing the poly layer, the conductive film and the ALD oxide layer about 300-400 nm at a periphery area and about 100-200 nm at a poly array area.

2. The method of forming the semiconductor structure of claim 1, further comprising:
    sealing the opening with the ALD oxide layer.

3. The method of forming the semiconductor structure of claim 1, further comprising:
    etching back the poly layer.

4. The method of forming the semiconductor structure of claim 3, wherein the poly layer is etched back by Boron Trichloride (BCl3) and Chlorine (Cl2).

5. The method of forming the semiconductor structure of claim 3, further comprising:
    depositing two harkmask layers.

6. The method of forming the semiconductor structure of claim 1, wherein the conductive film is in contact with the contact of the substrate.

7. The method of forming the semiconductor structure of claim 1, wherein forming the dielectric stack comprises:
    forming a first oxide structure over the substrate; and
    forming a second oxide structure over the first oxide structure.

8. The method of forming the semiconductor structure of claim 7, wherein forming the dielectric stack further comprises:
    forming a first nitride structure over the substrate;
    forming a second nitride structure over the first oxide structure; and
    forming a third nitride structure over the second oxide structure.

9. The method of forming the semiconductor structure of claim 8, wherein forming the second nitride structure over the first oxide structure is performed such that the first oxide structure is between the first nitride structure and the second nitride structure.

10. The method of forming the semiconductor structure of claim 8, wherein forming the third nitride structure over the second oxide structure is performed such that the second oxide structure is between the second nitride structure and the third nitride structure.

11. The method of forming the semiconductor structure of claim 1, wherein etching the poly layer and the dielectric stack to form the opening is performed by dry etching.

* * * * *